United States Patent
Messersmith et al.

(10) Patent No.: US 11,303,275 B2
(45) Date of Patent: Apr. 12, 2022

(54) RELAY CIRCUITRY WITH SELF REGULATING CHARGING

(71) Applicant: Rockwell Automation Technologies, Inc., Mayfield Heights, OH (US)

(72) Inventors: David W. Messersmith, Kenosha, WI (US); William T. Glaser, Waukesha, WI (US); Michael J. Lemberger, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/011,739

(22) Filed: Sep. 3, 2020

(65) Prior Publication Data
US 2022/0069819 A1    Mar. 3, 2022

(51) Int. Cl.
| | | |
|---|---|---|
| H03K 17/687 | (2006.01) | |
| H03K 17/18 | (2006.01) | |
| H02M 1/32 | (2007.01) | |
| H02H 7/12 | (2006.01) | |

(52) U.S. Cl.
CPC ....... *H03K 17/6877* (2013.01); *H02H 7/1213* (2013.01); *H02M 1/32* (2013.01); *H03K 17/18* (2013.01)

(58) Field of Classification Search
CPC .. H03K 17/6877; H03K 17/18; H02H 7/1213; H02M 1/32
USPC ......................................................... 327/536
See application file for complete search history.

(56) References Cited

U.S. PATENT DOCUMENTS

| | | |
|---|---|---|
| 5,510,950 A | 4/1996 | Bills et al. |
| 7,148,738 B2 | 12/2006 | Knoop et al. |
| 7,679,370 B2 | 3/2010 | Nair |
| 8,729,914 B2 | 5/2014 | Domes |
| 2014/0292292 A1* | 10/2014 | Koski ................. H02M 3/1588 323/271 |
| 2015/0253743 A1 | 9/2015 | Lee et al. |

FOREIGN PATENT DOCUMENTS

| | | |
|---|---|---|
| EP | 0755117 A1 | 1/1997 |
| GB | 2302466 A | 1/1997 |
| JP | 2012039199 A | 2/2012 |
| KR | 101223403 B1 | 1/2013 |

OTHER PUBLICATIONS

Aono, et al.; ECE 480 Design Team 5 Final Report; Over-Current Protection Reference Design & Study; pp. 1-52; Apr. 26, 2011, Michigan State University—Texas Instruments.
European Search Report; EP Application No. 21190549.2; dated Jan. 19, 2022.

* cited by examiner

*Primary Examiner* — Tomi Skibinski
(74) *Attorney, Agent, or Firm* — Fletcher Yoder, PC

(57) ABSTRACT

A system may include a power source. The power source supplies a first voltage. The system may also include a voltage regulator that receives the first voltage and supply a second voltage. Additionally, the system may include a microcontroller that receives the second voltage and output the second voltage via an output pin. Further, the system may include a switching element that receives the second voltage from the output pin of the controller at a first terminal and receives the first voltage from the power supply at a second terminal. The switching element selectively charges a first capacitor based on a difference between the first voltage and the second voltage.

18 Claims, 4 Drawing Sheets

RELAY CIRCUITRY WITH SELF REGULATING CHARGING

BACKGROUND

The present disclosure relates generally to relay circuitry, and more particularly to regulating voltage used to power components of a controller (e.g., a microcontroller) and a switching device of the relay circuitry. Switching devices are generally used throughout industrial, commercial, material handling, process and manufacturing settings, to mention only a few. As used herein, "switching device" is generally intended to describe any electromechanical switching device, such as mechanical switching devices (e.g., a contactor, a relay, air break devices, and controlled atmosphere devices) or solid-state devices (e.g., a silicon-controlled rectifier (SCR)). More specifically, switching devices generally open to disconnect electric power from a load and close to connect electric power to the load. For example, switching devices may connect and disconnect three-phase electric power to an electric motor.

In some instances, the relay circuitry may include switching device that may be integrated with a controller or control system, such that the switching device may operate based on certain logic operations. To efficiently operate the relay circuitry, the microcontroller and the switching device may share voltage from the same power source. However, the sharing of the same voltage source may cause the microcontroller, the switching device, or other circuit components to operate ineffectively under certain circumstances. Accordingly, improved systems and methods to regulate the voltage supplied to relay circuitry are desired.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a system includes a power source. The power source supplies a first voltage. The system also includes a voltage regulator that receives the first voltage and supply a second voltage. Additionally, the system includes a microcontroller that receives the second voltage and output the second voltage via an output pin. Further, the system includes a switching element that receives the second voltage from the output pin of the controller at a first terminal and receives the first voltage from the power supply at a second terminal. The switching element selectively charges a first capacitor based on a difference between the first voltage and the second voltage.

In another embodiment, an electronic device includes a microcontroller. The microcontroller receives a first voltage from a regulated power source and outputs the first voltage via an output pin. The first voltage corresponds to a rating for operating the microcontroller. The system also includes a switching element that receives the first voltage at a first terminal and receive a second voltage from a power supply at a second terminal. The power supply provides power to the regulated power source. The switching element selectively charges a first capacitor coupled to the power supply via the switching element based on a difference between the first voltage and the second voltage.

In yet another embodiment, a system includes a microcontroller. The microcontroller receives a first voltage from a regulated power source and outputs the first voltage via an output pin and the regulated power source receives power from a power source. The system also includes a charge circuit having a plurality of switching elements that couples the power source to a load and the plurality of switching elements includes a first switching element, a second switching element, and a third switching element coupled to each other. The first switching element receives the first voltage at a first terminal of the first switching element via the output pin, receives a second voltage at a second terminal of the first switching element and the second voltage corresponds to ground, and selectively outputs the second voltage to the second switch based on a first difference between the first voltage and the second voltage. The second switching element receives the second voltage at a third terminal of the second switching element via the first switch, receives a third voltage at a fourth terminal of the second switching element via the power source; and selectively outputs the first voltage to the third switch based on a second difference between the third voltage and the second voltage. The third switching element receives the first voltage at a fifth terminal of the third switching element via the power source, receives the third voltage from the power source at a sixth terminal; and selectively outputs the third voltage based on a third difference between the first voltage and the second voltage.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Relay circuitry, such as overload relay devices, may include a switching device (e.g., transistor, MOSFET) that controls the flow of current to a load and a controller (e.g., microcontroller) or control system that controls various other operations of the relay circuitry. As discussed above, the switching device and the controller may share the same voltage source. In some instances, when the controller outputs a voltage that causes the switching device to activate, the switching device may electrically couple a circuit element (e.g., a capacitor) to a load, thereby causing the circuit element to discharge. Since a common external power source may supply a voltage to both the circuit element and the controller, the voltage consumed by the charging circuit element may reduce the amount voltage available to the controller at certain times. That is, the voltage source may be used to charge the circuit element while also supplying the voltage to the controller. This sharing of voltage may reduce the efficiency of the controller by providing a voltage less than a threshold voltage associated with an operational voltage for the controller (e.g., brown out). Accordingly, the present embodiments described herein include charge circuitry that may be used to regulate the voltage supplied to the circuit element and the controller to ensure that the controller continuously receives a voltage that exceeds the threshold voltage, thereby reducing the risk of experiencing brown outs or a loss of power.

Figure 1:
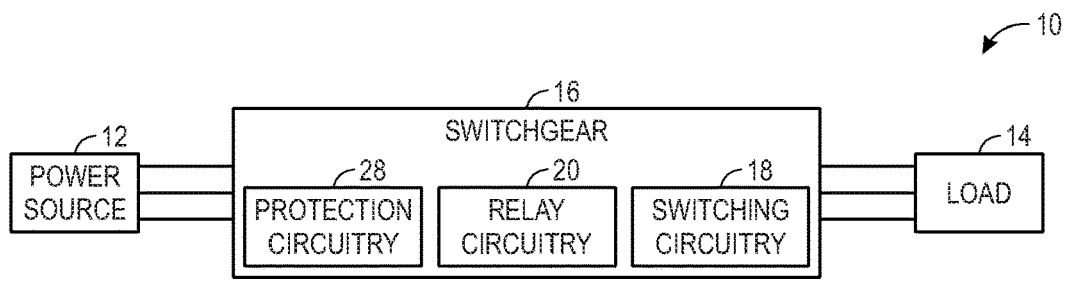
FIG. 1 is a diagrammatical representation of an example switching device that may provide power to an electrical load, in accordance with an embodiment.

By way of introduction, FIG. 1 depicts an example system 10 that the present embodiments may be employed. The system 10 may include a power source 12, a load 14, and switchgear 16, which includes one or more switching devices that may be controlled using the techniques described herein. In the depicted embodiment, the switchgear 16 may selectively connect and/or disconnect electric power by the power source 12 to the load 14, which may be an electric motor or any other powered device. In this manner, electrical power flows from the power source 12 to the load 14. For example, the switching circuitry 18 in the switchgear 16 may close to connect electric power to the load 14. On the other hand, the switching circuitry 18 in the switchgear 16 may open to disconnect electric power from the load 14.

In some embodiments, the switching circuitry 18 may be controlled by way of relay circuitry 20. The relay circuitry 20 may include switching devices that operate based on control signals. The control signals may be generated based on certain conditions, such as current exceeding a threshold. In any case, the relay circuitry 20 may control current flow to a load (e.g., electromagnet) to cause electrical contacts to change states in response to a detected condition (e.g., overload). The change of states by the contacts may be used to control the operation of the switching circuitry 18 or any other suitable control mechanism.

Additionally, as depicted, the switchgear 16 will typically include or function with protection circuitry 28 and the actual switching circuitry 18 that makes and breaks connections between the power source and the motor windings. More specifically, the protection circuitry 28 may include fuses and/or circuit breakers, and the switching circuitry 18, as will be described in more detail below, will typically include relays, contactors, and/or solid-state switches (e.g., SCRs, MOSFETs, IGBTs, and/or GTOs), such as within specific types of assembled equipment (e.g., motor starters).

Figure 2:
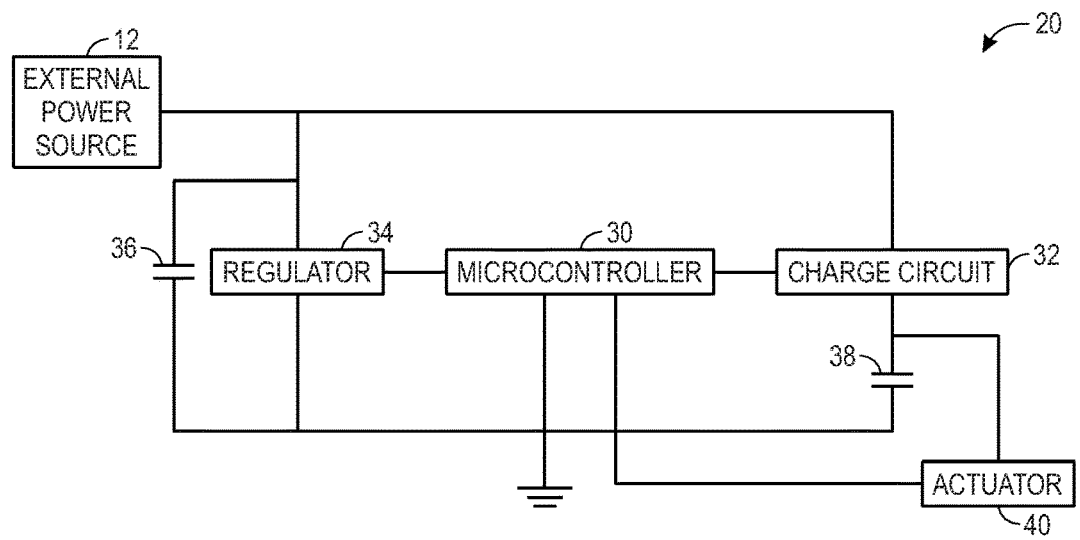
FIG. 2 is a block diagram of relay circuitry integrated with a controller that selectively activates a charge circuit, in accordance with an embodiment.

With the foregoing in mind, FIG. 2 illustrates an example block diagram of an embodiment the relay circuitry 20 that may be used to monitor various conditions that may be present in the switchgear 16, as discussed above with respect to FIG. 2, or other connected electrical system. In the illustrated embodiment, the relay circuitry 20 includes a microcontroller 30, a charge circuit 32, a voltage regulator 34, and an actuator 40. The microcontroller 30 is generally a logic driven device that controls signals to the switching devices, monitors conditions of the switching circuitry 18, as discussed above with respect to FIG. 2. and selectively activates and/or deactivates a charge circuit 32 to supply a voltage to the actuator 40, as will be discussed in more detail with regards to FIG. 3. In some embodiments, the microcontroller 30 may be a programmable logic controller (PLC) that locally (or remotely) controls operation of the switching devices. That is, the microcontroller 30 may provide a control signal that causes the actuator 40 to activate or energize, which causes a storage capacitor 38 to supply a voltage to a connected load. In some embodiments, the actuator 40 may include an H-bridge circuit. For example, an H-bridge circuit is used to actuate the latching relay. As such, a first polarity causes a relay associated with the actuator to trip and a second polarity causes the relay to reset.

The microcontroller 30 may include a communication component, a processor, a memory, a storage, input/output (I/O) ports, and the like. The communication component may be a wireless or wired communication component that may facilitate communication between different components within the industrial automation system, the actuator of the relay, or the like.

The processor may be any type of computer processor or microprocessor capable of executing computer-executable code. The processor may also include multiple processors that may perform the operations described below. The memory and the storage may be any suitable articles of manufacture that can serve as media to store processor-executable code, data, or the like. These articles of manufacture may represent computer-readable media (e.g., any suitable form of memory or storage) that may store the processor-executable code used by the processor to perform the presently disclosed techniques. The memory and the storage may represent non-transitory computer-readable media (e.g., any suitable form of memory or storage) that may store the processor-executable code used by the processor to perform various techniques described herein. It should be noted that non-transitory merely indicates that the media is tangible and not a signal.

The I/O ports may be interfaces that may couple to other peripheral components such as input devices (e.g., keyboard, mouse), sensors, input/output (I/O) modules, and the like. It should be noted that the components described above with regard to the microcontroller 30 are exemplary components and the microcontroller 30 may include additional or fewer components as shown.

In the depicted embodiment, the relay circuitry 20 includes two power storage devices (i.e., a holdup capacitor 36 and a storage capacitor 38) and a power source (i.e., an external power source 12, 6V). The holdup capacitor 36 may supply a voltage (e.g., VDD, 3.3V) to the microcontroller 30. More specifically, in the depicted embodiment, the holdup capacitor 36 may supply a voltage to the regulator 34, which then supplies a modified voltage (e.g., VDD, 3.3V) to the microcontroller 30 to enable the microcontroller 30 to control operation of switching devices as discussed herein. For example, the regulator 34 may regulate the voltage supplied to the microcontroller 30 from the holdup capacitor 36, such that a minimum voltage (e.g., VDD, 3.3V) that is suitable for providing power to the components (e.g., a processor, a memory, and the like) of the microcontroller 30 is supplied to the microcontroller 30.

The external power source 12 may supply a voltage (e.g., Vrail, 6V) to the holdup capacitor 36 to charge the holdup capacitor 36. Additionally, the external power source 12 supplies a voltage (e.g., Vrail, 6V) to a storage capacitor 38 when the charge circuit 32 is activated by the microcontroller 30, as will be discussed in more detail below. In some embodiments, the charge circuit 32 may include a switching device (e.g., MOSFET) with a gate voltage supplied by the microcontroller 30. For example, the MOSFET may be a p-MOSFET. As such, the charge circuit 32 activates in response to the microcontroller 30 providing a low voltage (e.g., ground or a binary low signal) to a gate terminal of the p-MOSFET of the charge circuit 32. When the charge circuit 32 activates, current flows through the charge circuit 32 and the external power source 12 supplies a voltage that charges the storage capacitor 38. More specifically, in embodiments where the charge circuit 32 includes at least one p-MOSFET with a gate terminal coupled to the microcontroller 30 (i.e., via an output pin of the microcontroller 30), the charge circuit 32 activates when the voltage at the gate terminal of the p-MOSFET of the charge circuit 32 is low relative to a voltage supplied by the external power source 12 (e.g., at the source terminal of the p-MOSFET). For example, when the gate terminal of the p-MOSFET is connected to an output pin (e.g., providing a regulated voltage less than VDD) of the microcontroller 30, the charge circuit 32 activates for a time period until the storage capacitor 38 is charged. To deactivate the charge circuit 32, the microcontroller 30 may float (e.g., remove voltage from the output pin) the gate terminal, and thus stop the external power source 12 from charging the storage capacitor 38. In some embodiments, the microcontroller 30 may float the gate terminal to a voltage greater than Vcc (e.g., 1 V, 2 V, and 3V higher than Vcc).

It should be noted that when the capacitance of the storage capacitor 38 is relatively larger than (e.g., greater than 50 times) the capacitance of the holdup capacitor 36, charging the storage capacitor 38 (e.g., using the external power source 12) may cause a brown out of the microcontroller 30. More specifically, due the capacitance of the storage capacitor 38 being greater than the capacitor of the holdup capacitor 36, the amount of current supplied to the holdup capacitor 36 may be lower than an amount that the holdup capacitor 36 should have to supply enough voltage to the microcontroller 30 to enable the microcontroller 30 to operate. Accordingly, if the charge circuit 32 is activated for a relatively long time period (e.g., 1 µs, 2 µs, 5 µs, 10 µs, 50 µs, and, greater than 100 µs), then the charging of the storage capacitor 38 will drain the voltage of the holdup capacitor 36 that may be supplied to the microcontroller 30 by the regulator 34, such that the microcontroller 30 may experience a brownout, a loss of power, or reset. Additionally, if the charge circuit 32 is activated for a relatively short time period (e.g., less than 1 µs), then the energy supplied by the external power source 12 to the storage capacitor 38 may not be sufficient to completely charge the storage capacitor.

With this in mind, in some embodiments, a voltage output by the microcontroller 30 may be used to selectively activate the charge circuit 32, while maintaining a minimum voltage to continue efficient operation of the microcontroller 30. For example, in some embodiments, the microcontroller 30 may include an output pin that may not be a regulated voltage (e.g., does not include a voltage regulating device such as a Zener diode, a voltage clamp, and the like). This pin may be referred to as a general-purpose input/output (GPIO). As such, the GPIO pin of the microcontroller 30 may provide a pass through voltage via the microcontroller 30 to provide VDD to the charge circuit 32. By connecting the unregulated output (e.g., VDD, 3.3V) of the microcontroller 30 to an input the charge circuit 32 (e.g., a gate terminal of a MOSFET device of the charge circuit 32), the charge circuit 32 may initially activate (e.g., close), thereby connecting the external power source 12 to the storage capacitor 38. The charge circuit 32 may then automatically deactivate (e.g., open) when the voltage supplied to the microcontroller 30 via the external power source 12 approaches the minimum voltage for maintaining the operation of the microcontroller 30. That is, the voltage supplied by the external power source 12 may not fall (e.g., decrease) to a voltage that is lower than the minimum voltage for maintaining operation of the microcontroller 30 because the switching element 42 may automatically turn off when the voltage (e.g., Vrail) provided by the external power source 12 falls to approximately VDD+Vgs. As a result, the external power source 12 may continuously provide a rail voltage that is greater than a threshold amount (e.g., VDD) to provide the minimum voltage for maintaining operation of the microcontroller 30 to the microcontroller 30.

Figure 3:
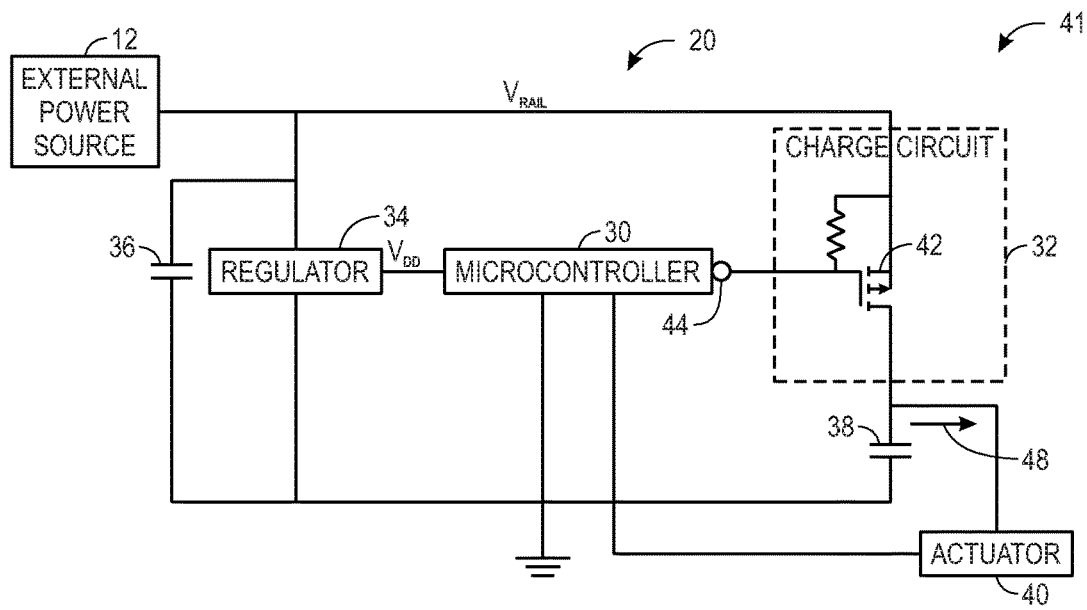
FIG. 3 is a block diagram of a charge circuit incorporated into the relay circuitry of FIG. 2, in accordance with an embodiment.

Keeping the foregoing in mind, FIG. 3 illustrates an example circuit 41 of the relay circuitry 20 that includes the charge circuit 32 with a switching element 42 that is connected to a GPIO 44 of the microcontroller 30. While the switching element 42 is illustrated as a p-MOSFET it should be noted that the switching element may include other types of semiconductor devices. In general, the switching element 42 selectively activates the switching element 42 to enable current to flow from the external power source 12 to the storage capacitor 38 based on a difference between the voltage supplied by the GPIO 44 at the gate terminal of the switching element 42 and the voltage supplied by the external powers source 12 at the source terminal of the switching element 42. In this depicted embodiment, the switching element 42 activates when the difference between the gate voltage and the voltage supplied by the external power source 12 is greater than a switching threshold, such as a transistor threshold (e.g., ~0.7 V) corresponding to the p-MOSFET. In the depicted embodiment, the microcontroller 30 is communicatively coupled to the actuator 40 and the storage capacitor 38 is selectively electrically coupled to the actuator 40. Accordingly, the storage capacitor 38 discharges when the microcontroller 30 outputs a control signal that causes the actuator 40 to electrically couple to the storage capacitor 38.

To better illustrate the operation of the actuator 40, the different stages of operation for the relay circuitry 20 is described below. When the storage capacitor 38 is initially coupled to the actuator 40, the microcontroller 30 may output a voltage (e.g., VDD, 3.3V) via the GPIO 44 to the gate terminal of the switching element 42 while the external power source 12 provides a relatively higher voltage signal (e.g., Vrail, 6V) to the source terminal of the switching element 42. That is, when the voltage supplied by the external power source 12 is greater than the voltage supplied by the GPIO 44, the switching element 42 is activated. As such, current flows from the external power source 12 towards the charging circuit 32, such that the external power source 12 charges the storage capacitor 38. As mentioned above, the voltage from the external power source 12 is supplied to the source terminal of the switching element 42. Additionally, the voltage output from the GPIO 44 of the microcontroller is supplied to the gate terminal of the switching element 42. Accordingly, the switching element 42 (i.e., the p-MOSFET) activates and enables current to flow from the external power source 12 towards the capacitor 38 when the difference between the voltage supplied by the external power source 12 and the voltage supplied by the GPIO 44 is above a voltage threshold. For example, when the switching element 42 is a p-MOSFET, the voltage threshold may correspond to a transistor threshold, such as 0.7 V. As such, the switching element 42 activates causing current to flow from the external power source 12 to the storage capacitor 38 to charge the storage capacitor 38 when the difference between the voltage supplied by the external power source 12 and the voltage supplied by the GPIO is greater than the voltage threshold corresponding to the switching element 42. In other words, the switching element 42 closes due to the difference in the source and gate terminals of the switching element 42. As a result of the switching element 42 closing, the current flows from the storage capacitor 38 in a direction 48 towards the actuator 40. In some embodiments, the switching element 42 closes after the storage capacitor 38 is charged to a voltage threshold (e.g., 10% charged, 25% charged, 50% charged, and 100% charged). In such embodiments, the storage capacitor 38 is charged to the voltage threshold before current (e.g., flowing in the direction 48) is applied to the actuator 40.

After the actuator 40 is electrically uncoupled from the storage capacitor 38, the GPIO 44 of the microcontroller 30 continues to supply the regulated voltage (e.g., VDD) to the gate terminal of the switching element 42. However, the voltage (e.g., Vrail) provided to the source terminal of the switching element 42 has begun to decrease due to the charging of the capacitor 38. When the difference between the voltage supplied by the external power source 12 and the voltage supplied by the GPIO is approximately equal to the voltage threshold (e.g., Vgs), the switching element 42 deactivates (e.g., opens), thereby preventing current flow from the external power source 12 to the storage capacitor 38. In this way, the switching element 42 may automatically turn off (e.g., deactivate, open) based on the difference between the voltage supplied by the external power source 12 and the voltage supplied by the GPIO.

Figure 4:
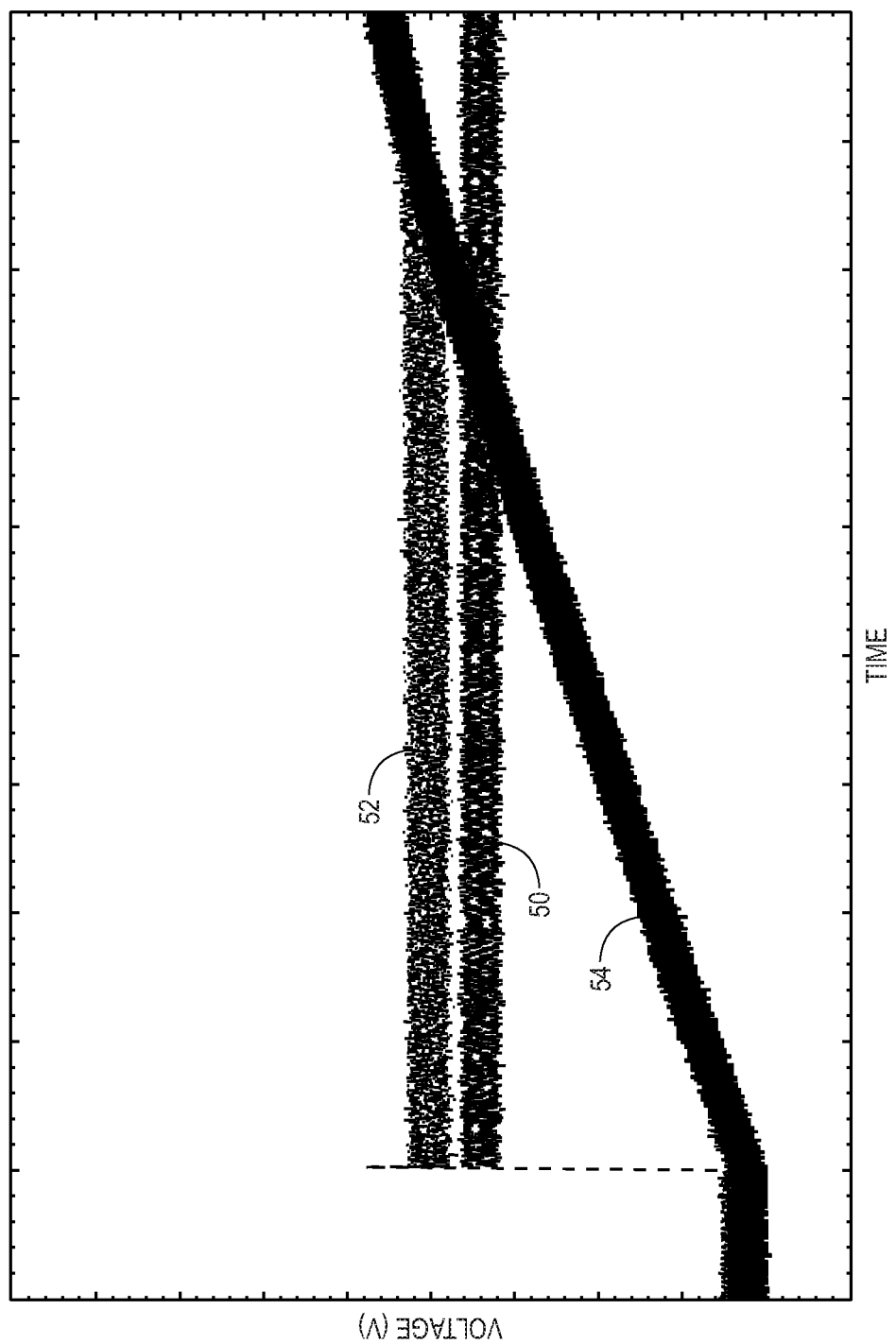
FIG. 4 is a voltage-time graph that depicts a voltage supplied from a controller, an external power source, and the charge in the storage capacitor of the relay circuitry in FIG. 2, in accordance with an embodiment.

Accordingly, the voltage supplied by the external power source 12 to the holdup capacitor 36 remains above a minimum voltage that enables the microcontroller 30 to maintain operation of the components with the microcontroller 30. In this way, the microcontroller 30 controls charging of the storage capacitor 38 and prevents the microcontroller 30 from not receiving enough power by outputting a voltage from a non-voltage limited output of a microcontroller 30. To further illustrate this, FIG. 4 shows a graph depicting the voltage supplied to the microcontroller 30 by the regulator 34 (e.g., line 50), the voltage supplied by the external power source 12 (e.g., line 52), and the charging of the storage capacitor 38 (e.g., line 54). As shown, the voltage depicted by line 50 remains constant indicating that the voltage supplied to the microcontroller 30 remains above a minimum voltage that enables the microcontroller 30 to operate fully. Additionally, the voltage depicted by line 52 drops to approximately the voltage depicted by line 50 plus approximately 0.6 V (e.g., the threshold voltage of the switching element 42). Further, the storage capacitor 38 continues to charge.

Figure 5:
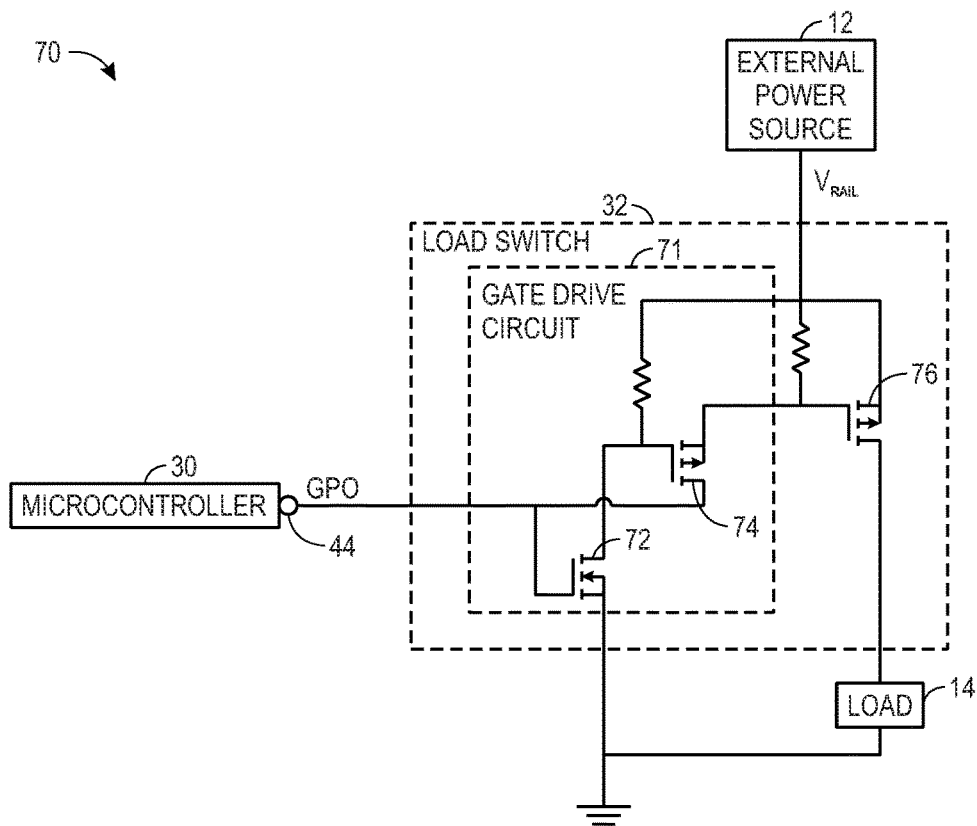
FIG. 5 is a circuit diagram of an embodiment of the charge circuit including multiple switching elements to prevent the voltage supplied from an external power source from falling below a threshold voltage supplied to the controller, in accordance with an embodiment.

While the discussion above generally relates to a charge circuit 32 having one switching element 42 that was a p-MOSFET, it should be noted that additional suitable configurations (e.g., n-MOSFET) may be implemented in accordance with the present disclosure. As a non-limiting example of an additional configuration for the charge circuit 32, FIG. 5 illustrates an example circuit 70 of the charge circuit 32 with a gate drive circuit 71. In the depicted embodiment, the gate drive circuit 71 includes a first switching element 72 and a second switching element 74. In operation, the GPIO 44 supplies a voltage to the gate terminal of the first switching element 72 (e.g., an n-MOSFET) and the GPIO 44 supplies the voltage to the drain terminal of the second switching element 74 (e.g., a p-MOSFET), and the external power source 12 (not shown) supplies a voltage to a third switching element 76 (e.g., a p-MOSFET, which may be similar to the switching element 42). In the depicted embodiment, the first switching element 72 activates and, in response, the GPIO 44 supplies a high voltage, such as a voltage that corresponds to the minimum voltage to maintain operation of the microcontroller 30. When the first switching element 72 activates, the second switching element 74 activates, which in turn supplies the voltage supplied by the GPIO 44 to the third switching element 76. Thus, the third switching element 76 activates when the difference between the voltage supplied by the external power source 12 and the voltage supplied by the GPIO is greater than the voltage threshold corresponding to the third switching element 76. In this way, the third switching element 76 is deactivated when the GPIO 44 supplies a low voltage, and thus, prevents the voltage supplied by the external power source 12 from falling below the voltage supplied to the microcontroller.

Figure 6:
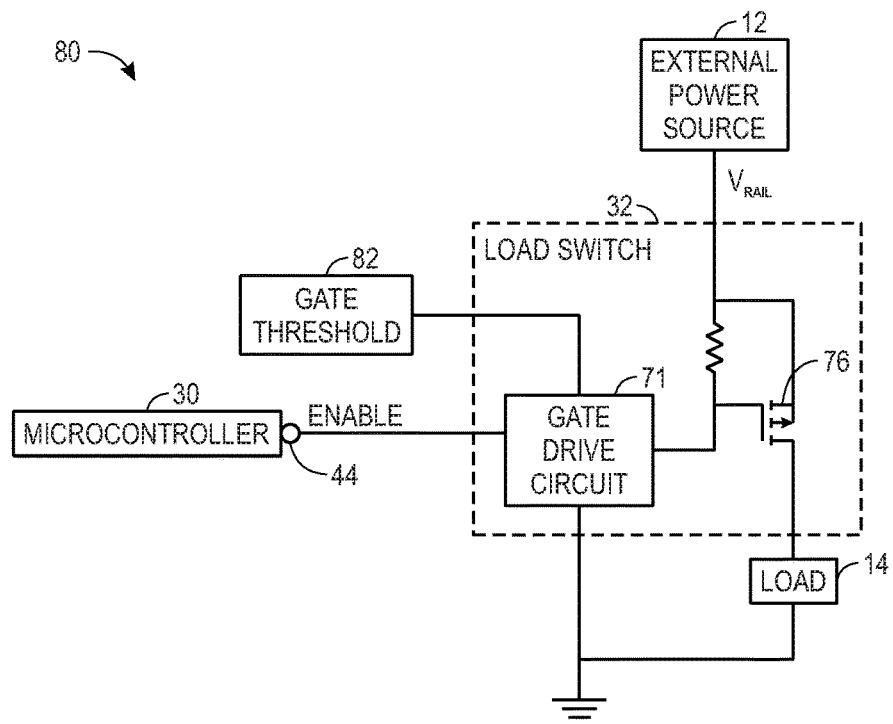
FIG. 6 is a circuit diagram of an embodiment of the charge circuit where a threshold voltage may be supplied to a switching element, in accordance with an embodiment.

As another non limiting example of a configuration for the charge circuit 32, FIG. 6 illustrates an example circuit 80 of the charging circuit 32. The operation of the circuit 80 is generally similar to the operation of the circuit 70 of FIG. 7, but a gate threshold voltage 82 is also supplied to gate drive circuit 71. In operation, the gate threshold voltage 82 is supplied to the gate terminal of the switching element 76 when the output of the GPIO 44 is in a logic high state. As such, the switching element 76 turns off when the difference between the voltage supplied by the external power source 12 and the threshold voltage 82 falls below a gate threshold (e.g., approximately 0.7 V).

Figure 7:
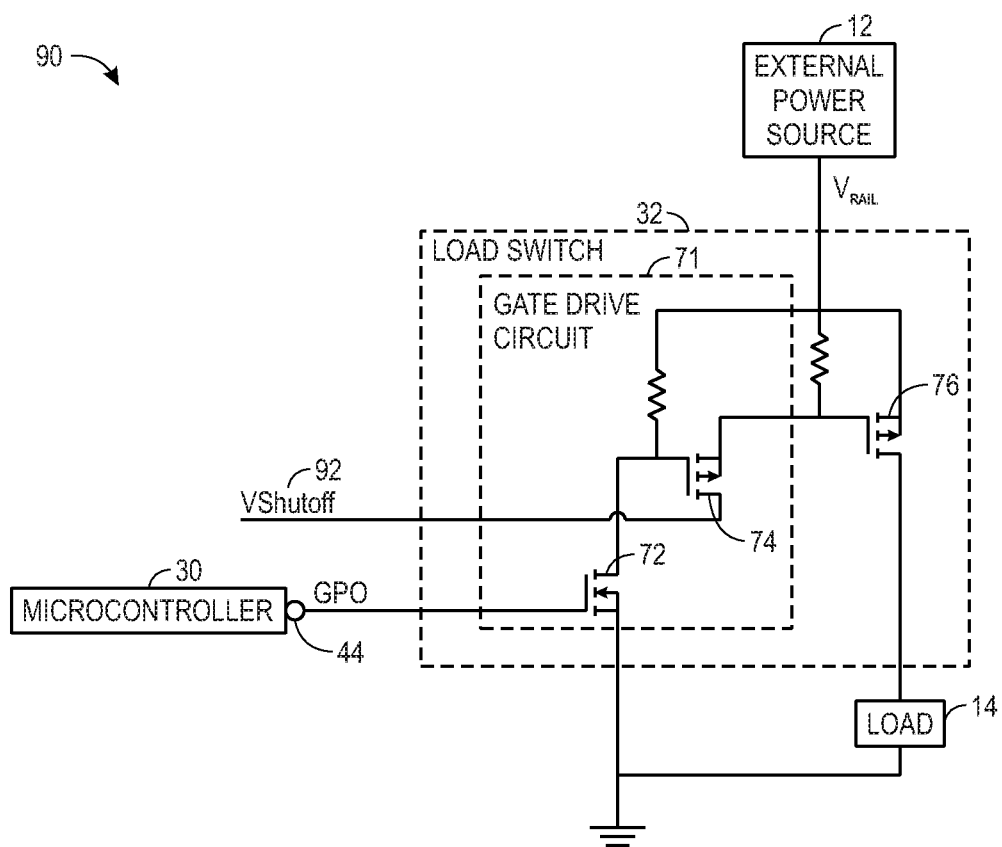
FIG. 7 is a circuit diagram of a load switch that directly controls the flow of current to a storage capacitor, in accordance with an embodiment.

As another non limiting example of a configuration for the charge circuit 32, FIG. 7 illustrates an example circuit 80 of the charging circuit 32. The operation of the circuit 80 is generally similar to the operation of the circuit 70 of FIG. 7, but a shut off voltage 92 is also supplied to gate terminal of the third switching element 76. As such, the switching element 76 turns off when the difference between the voltage supplied by the external power source 12 and the shut off voltage 92 falls below a gate threshold (e.g., approximately 0.7 V). In this way, a voltage that is different than the voltage supplied by the GPIO 44 may be used to selectively activate and/or deactivate the third switching element 76. It should be noted that in any of the example circuits 70, 80, and 90 described above, in some embodiments, a pulse width modulation (PWM) output may be applied to any input within the gate drive circuit 71 (e.g., the gate terminals of the switching elements 72, 74, and 76). Additionally or alternatively, a PWM may be applied to the voltage threshold voltage 82 to selectively activate the first switching element 72 (e.g., the switching element 42 as discussed with regards to FIG. 3).

Accordingly, the present disclosure relates to relay circuitry with a switching element that is configured to automatically disconnect when a voltage used to charge a capacitor associated with a load (e.g., actuator) causes a voltage provided to a microcontroller to fall below a threshold voltage. In some embodiments, the threshold voltage supplied to the microcontroller may correspond to a minimum voltage used to power components of the microcontroller. In this way, the techniques of the disclosure prevent, reduce, or block a likelihood of a brownout or loss of power by the microcontroller, while enabling the capacitor associated with the load to charge.

While only certain features of disclosed embodiments have been illustrated and described herein, many modifications and changes will occur to those skilled in the art. It is, therefore, to be understood that the appended claims are intended to cover all such modifications and changes as fall within the true spirit of the present disclosure.

The invention claimed is:

1. A system, comprising:
a power source configured to supply a first voltage;
a voltage regulator coupled to a holdup capacitor and configured to receive the first voltage and supply a second voltage;
a controller configured to receive the second voltage and output the second voltage via an output pin;
a switching element configured to receive the second voltage from the output pin of the controller at a first terminal and receive the first voltage from the power supply at a second terminal, wherein the switching element is configured to selectively charge a storage capacitor based on a difference between the first voltage and the second voltage, and wherein a capacitance of the storage capacitor is greater than a capacitance of the holdup capacitor.

2. The system of claim 1, wherein the switching element comprises a p-MOSFET, and wherein the first terminal corresponds to a gate terminal of the p-MOSFET.

3. The system of claim 1, wherein the switching element comprises a p-MOSFET, and wherein the second terminal corresponds to a source terminal of the p-MOSFET.

4. The system of claim 1, wherein the second voltage corresponds to a rated operating voltage for the controller.

5. The system of claim 1, wherein the output pin does not comprise a voltage regulating device.

6. The system of claim 1, wherein the output pin is a general-purpose input/output (GPIO) of the controller.

7. The system of claim 1, wherein the switching element is configured to automatically open in response to the second voltage being approximately equal to a sum of the first voltage and a threshold corresponding to the switching element.

8. An electronic device comprising:
a microcontroller configured to receive a first voltage from a regulated power source and output the first voltage via an output pin, wherein the first voltage corresponds to a rating for operating the microcontroller; and
a first switching element configured to:
receive the first voltage at a first terminal and receive a second voltage from a power supply at a second terminal, wherein the power supply is configured to provide power to the regulated power source; and
selectively charge a storage capacitor coupled to the power supply via the switching element based on a difference between the first voltage and the second voltage; and
a second switching element configured to:
receive the first voltage from the output pin at a third terminal of the second switching element; and
receive a third voltage at a fourth terminal of the second switching element, wherein the second switching element is configured to selectively output the first voltage to the first terminal based on a second difference between the first voltage and the third voltage.

9. The electronic device of claim 8, comprising a third switching element configured to:
receive the first voltage from the output pin at fifth terminal of the third switching element;
receive the third voltage at a sixth terminal of the second switching element, wherein the third switching element is configured to selectively output the third voltage to the fourth terminal based on a second difference between the first voltage and the third voltage.

10. The electronic device of claim 8, wherein the first switching element is configured to automatically open in response to the second voltage reaching a threshold corresponding to the sum of the first voltage and a threshold voltage of the switching element.

11. The electronic device of claim 8, wherein the output pin is a general-purpose input/output (GPIO) of the microcontroller.

12. The electronic device of claim 8, wherein the first switching element comprises a p-MOSFET, and wherein the first terminal corresponds to a gate terminal of the p-MOSFET.

13. A system, comprising:
a microcontroller configured to receive a first voltage from a regulated power source and output the first voltage via an output pin, wherein the regulated power source is configured to receive power from a power source; and
a charge circuit comprising a plurality of switching elements configured to couple the power source to a load, wherein the plurality of switching elements comprises a first switching element, a second switching element, and a third switching element coupled to each other, wherein the first switching element is configured to:

receive the first voltage at a first terminal of the first switching element via the output pin;
receive a second voltage at a second terminal of the first switching element, wherein the second voltage corresponds to ground; and
selectively output the second voltage to the second switch based on a first difference between the first voltage and the second voltage wherein the second switching element is configured to:
receive the second voltage at a third terminal of the second switching element via the first switch;
receive a third voltage at a fourth terminal of the second switching element via the power source; and
selectively output the first voltage to the third switch based on a second difference between the third voltage and the second voltage; and
wherein the third switching element is configured to:
receive the first voltage at a fifth terminal of the third switching element via the power source;
receive the third voltage from the power source at a sixth terminal; and
selectively output the third voltage based on a third difference between the first voltage and the second voltage.

14. The system of claim 13, wherein the first terminal corresponds to a gate terminal and the second terminal corresponds to a source terminal.

15. The system of claim 13, wherein the third terminal corresponds to a gate terminal and the fourth terminal corresponds to a source terminal.

16. The system of claim 13, wherein the output pin does not comprise a voltage regulating device.

17. The system of claim 13, wherein the second switching element, the third switching element, or both, comprise a p-MOSFET.

18. The system of claim 13, wherein the first switching element comprises an n-MOSFET.

* * * * *